United States Patent
Inukai et al.

(10) Patent No.: US 12,172,194 B2
(45) Date of Patent: *Dec. 24, 2024

(54) SUBSTRATE PROCESSING APPARATUS AND SUBSTRATE PROCESSING METHOD

(71) Applicant: KIOXIA CORPORATION, Tokyo (JP)

(72) Inventors: Minako Inukai, Yokohama (JP); Masatoshi Terayama, Kawasaki (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/496,222

(22) Filed: Oct. 27, 2023

(65) Prior Publication Data

US 2024/0058847 A1    Feb. 22, 2024

Related U.S. Application Data

(63) Continuation of application No. 17/695,512, filed on Mar. 15, 2022, now Pat. No. 11,833,550.

(30) Foreign Application Priority Data

Sep. 22, 2021  (JP) ................. 2021-154588

(51) Int. Cl.
  *B08B 13/00*  (2006.01)
  *B08B 3/02*  (2006.01)
  *H01L 21/67*  (2006.01)

(52) U.S. Cl.
  CPC ............... *B08B 13/00* (2013.01); *B08B 3/02* (2013.01); *H01L 21/67034* (2013.01); *H01L 21/67253* (2013.01)

(58) Field of Classification Search
  CPC ..... B08B 13/00; B08B 3/02; H01L 21/67034; H01L 21/67253
  See application file for complete search history.

(56) References Cited

U.S. PATENT DOCUMENTS 11,833,550 B2 * 12/2023 Inukai ............... H01L 21/67028
2006/0048792 A1    3/2006 Nakamura et al.
(Continued)

FOREIGN PATENT DOCUMENTS

JP    2001-53051 A    2/2001
JP    4324527 B2    9/2009
(Continued)

OTHER PUBLICATIONS

Machine translation of JP-2015023182-A (Year: 2015).*

*Primary Examiner* — Erin F Bergner
(74) *Attorney, Agent, or Firm* — Oblon, McClelland, Maier & Neustadt, L.L.P.

(57) ABSTRACT

A substrate processing apparatus for cleaning and drying a substrate under processing, including supplying a cleaning liquid onto the substrate under processing to form a cleaning liquid layer, supplying a gas onto the substrate under processing to partially remove the cleaning liquid layer and thus generate a first dry region on the substrate under processing, expanding the first dry region to generate a second dry region by controlling the movement speed of the boundary between the cleaning liquid layer and the first dry region to be less than or equal to a predetermined speed, and further expanding the second dry region to generate a third dry region.

19 Claims, 14 Drawing Sheets

(56) References Cited

U.S. PATENT DOCUMENTS

| | | | |
|---|---|---|---|
| 2007/0017555 A1* | 1/2007 | Sekiguchi | B08B 3/04 |
| | | | 134/21 |
| 2009/0250079 A1 | 10/2009 | Yoshihara | |
| 2012/0006361 A1 | 1/2012 | Miyagi et al. | |
| 2015/0194301 A1 | 7/2015 | Uemura et al. | |
| 2015/0303078 A1 | 10/2015 | Ishibashi | |
| 2019/0013217 A1 | 1/2019 | Marumoto | |

FOREIGN PATENT DOCUMENTS

| | | | |
|---|---|---|---|
| JP | 2012-19002 A | | 1/2012 |
| JP | 2014-123773 A | | 7/2014 |
| JP | 2015023182 A | * | 2/2015 |
| JP | 2015-133347 A | | 7/2015 |
| JP | 6386769 B2 | | 9/2018 |
| TW | 200623246 A | | 7/2006 |
| TW | 201919776 A | | 6/2019 |

\* cited by examiner

FIG.6
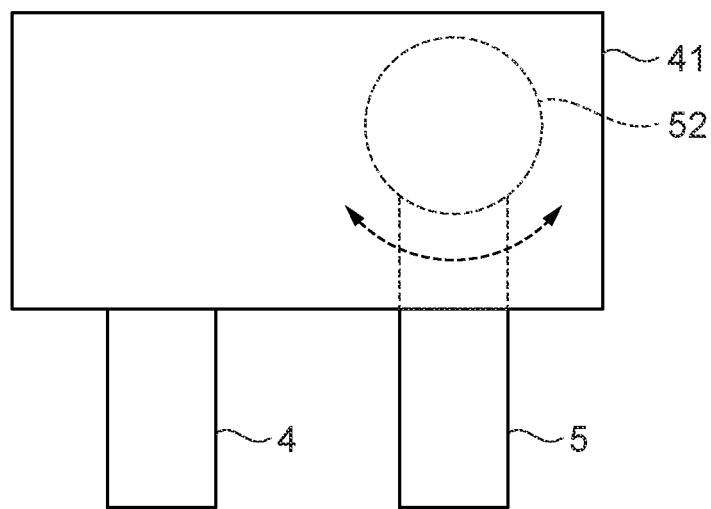
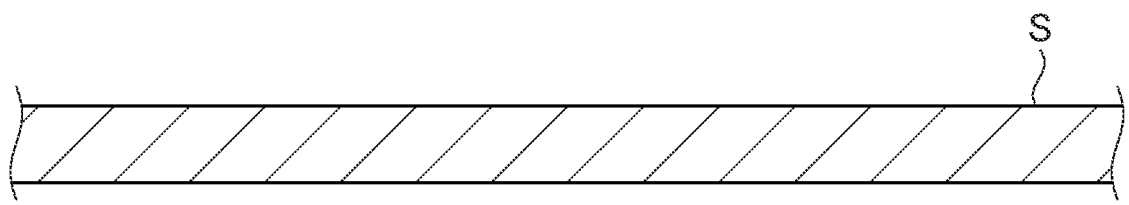

FIG.8
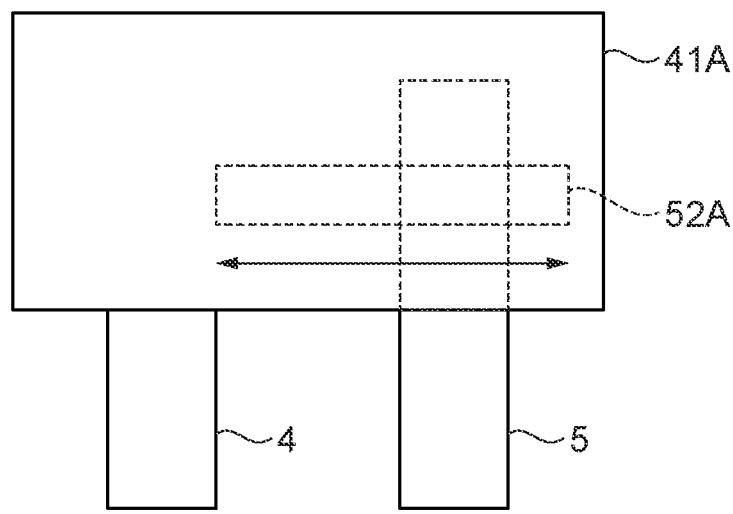
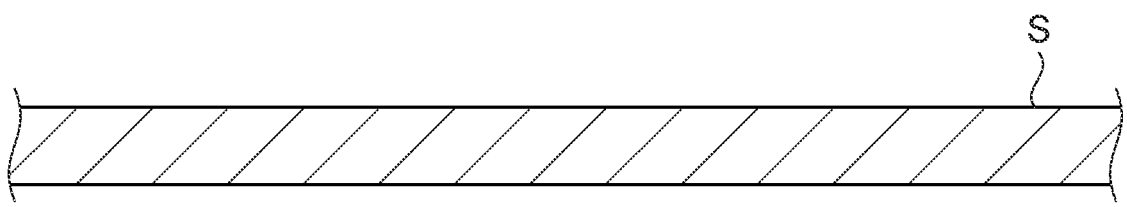

FIG.10
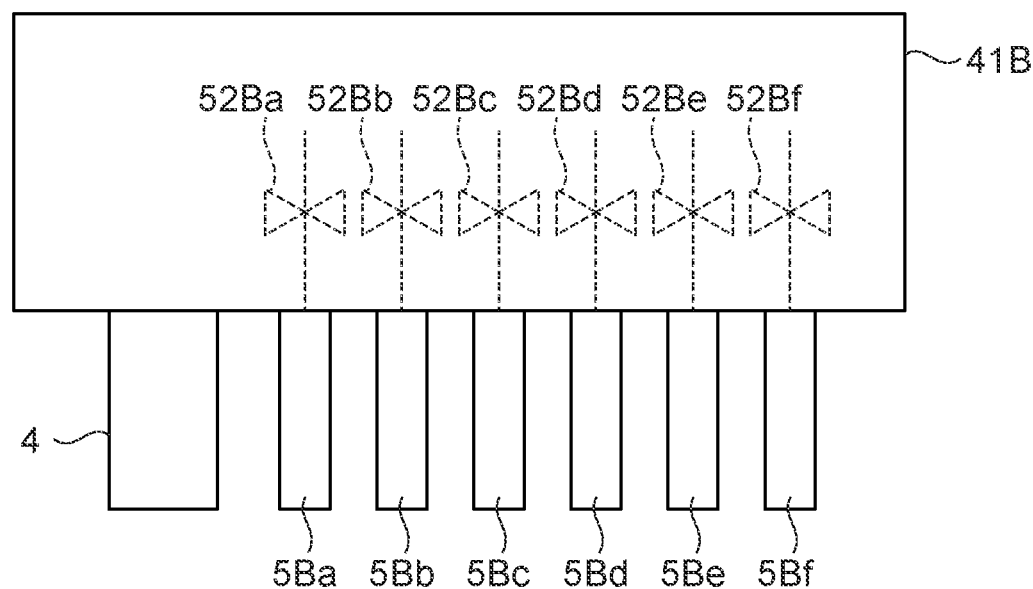
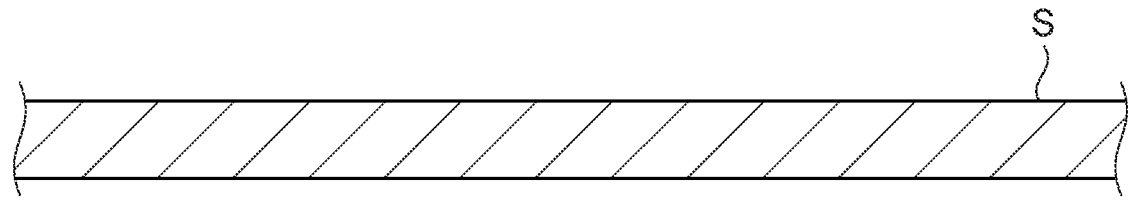

SUBSTRATE PROCESSING APPARATUS AND SUBSTRATE PROCESSING METHOD

CROSS-REFERENCE TO RELATED APPLICATION

This application is a continuation of and claims benefit under 35 U.S.C. § 120 to U.S. application Ser. No. 17/695,512 filed Mar. 15, 2022, and claims the benefit of priority under 35 U.S.C. § 119 from Japanese Patent Application No. 2021-154588 filed Sep. 22, 2021, the entire contents of each of which are incorporated herein by reference.

BACKGROUND OF THE INVENTION

Field of the Invention

Embodiments relate to a substrate processing apparatus and a substrate processing method.

Description of the Related Art

A substrate processing apparatus and a substrate processing method for cleaning and drying a substrate under processing are known.

BRIEF DESCRIPTION OF THE DRAWINGS

FIG. 6 is a view for illustrating a nozzle holding portion in FIG. 1;

FIG. 8 is a view for illustrating a first modified example of the nozzle holding portion in FIG. 1;

FIG. 10 is a view for illustrating a second modified example of the nozzle holding portion in FIG. 1;

DETAILED DESCRIPTION OF THE PREFERRED EMBODIMENTS

Hereinafter, the present embodiment will be described with reference to the accompanying drawings. For easy understanding of the description, components that are the same throughout the drawings are denoted by the same reference signs as much as possible, and repeated description will be omitted.

First Embodiment

Figure 1:
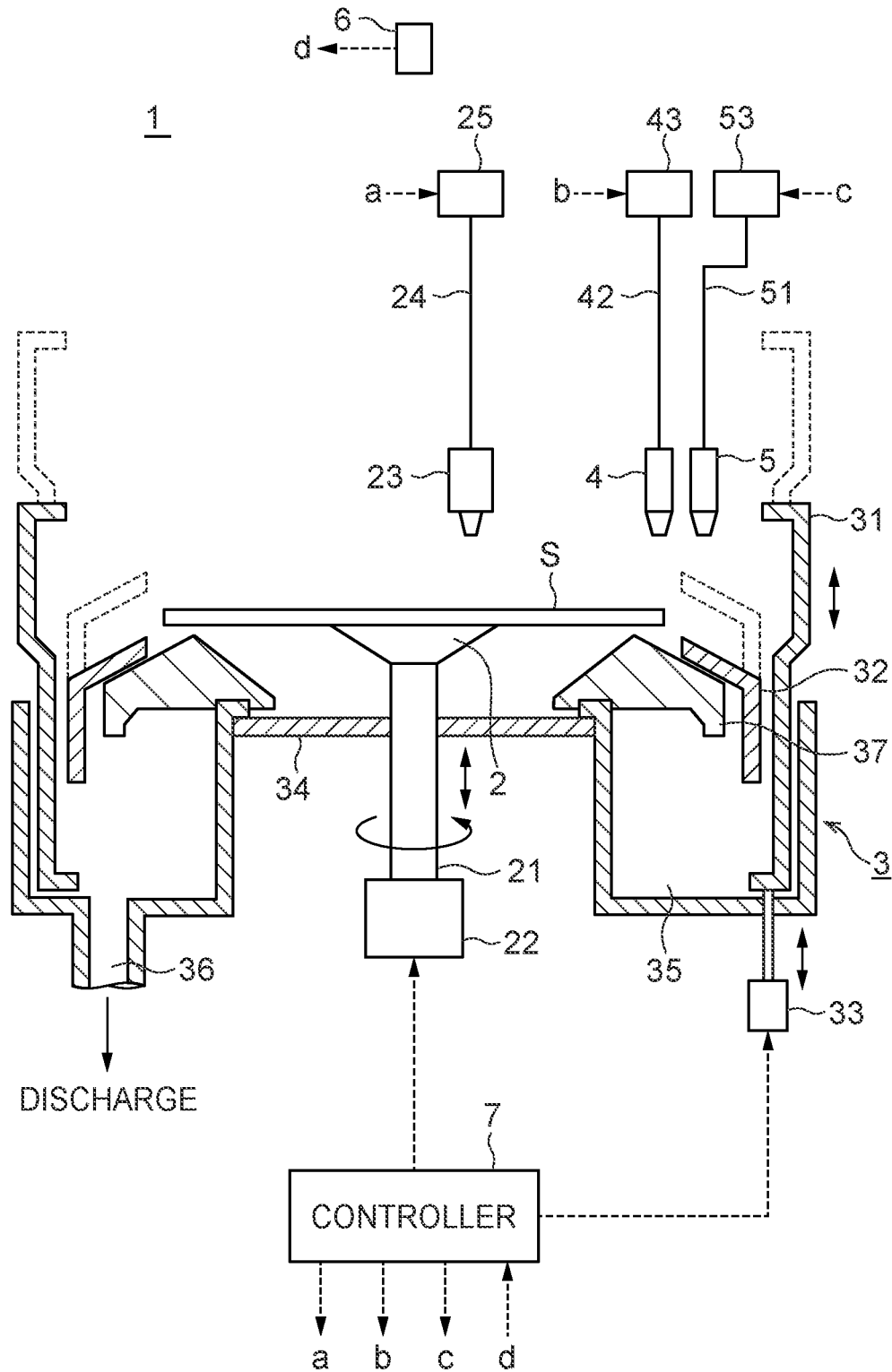
FIG. 1 is a longitudinal sectional view of a substrate processing apparatus of a first embodiment.
Figure 2:
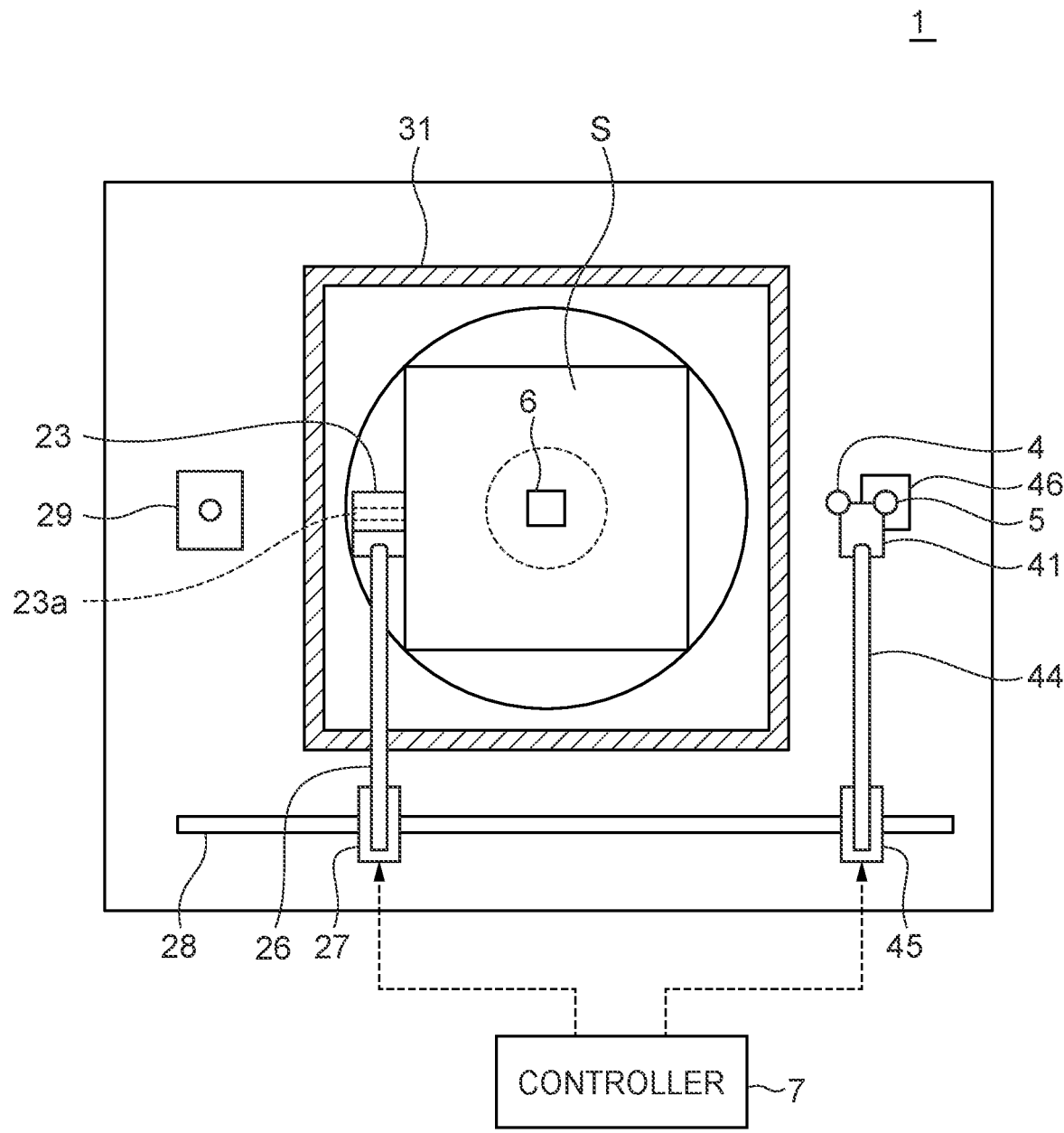
FIG. 2 is a plan view of the substrate processing apparatus of the first embodiment.

A substrate processing apparatus 1 of a first embodiment will be described with reference to FIGS. 1 and 2. The substrate processing apparatus 1 includes a spin chuck 2 and a cup body 3. The spin chuck 2 is a substrate holding portion for holding a substrate S in the horizontal posture by suctioning and attracting the central portion on the rear face side of the substrate S. For the substrate S, a quartz substrate, such as for a photomask or a template, is contemplated, for example. Alternatively, the substrate S may be a semiconductor wafer, such as a silicon substrate. An example in which the substrate S of FIG. 1 is a photomask will be described. The spin chuck 2 is connected to a drive mechanism 22 including a rotation mechanism via a rotating shaft 21. The spin chuck 2 is configured to be movable up and down while holding the substrate S. In FIG. 1, the substrate S is held such that the center of the substrate S is positioned above the rotating shaft 21 of the spin chuck 2.

The cup body 3, which is open on its upper side, is provided so as to surround the substrate S placed on the spin chuck 2. The cup body 3 includes an outer cup 31, an inner cup 32, an elevating/lowering portion 33, a circular plate 34, and a liquid receiving portion 35. The outer cup 31 has a quadrangular upper side and a cylindrical lower side, for example. The inner cup 32 has a tubular shape with its upper side inclined inward, for example. The outer cup 31 is moved up and down by the elevating/lowering portion 33 connected to the lower end portion of the outer cup 31. The inner cup 32 is configured to be movable up and down by being pushed up by a step portion (not illustrated) formed on the inner peripheral face on the lower end side of the outer cup 31.

The circular plate 34 is provided below the spin chuck 2. The liquid receiving portion 35 is provided around the entire circumference of the outer side of the circular plate 34. The liquid receiving portion 35 has a recessed cross-section. The liquid receiving portion 35 stores a developing solution, or a cleaning liquid spilled from or shaken off from the substrate S. The bottom face of the liquid receiving portion 35 has a drain discharge port 36 formed therein. The developing solution or the cleaning liquid stored in the liquid receiving portion 35 is discharged to the outside of the apparatus through the drain discharge port 36.

A ring member 37 is provided on the outer side of the circular plate 34. The ring member 37 is a member with a chevron-shaped cross-section. The ring member 37 is configured to be able to hold the inner cup 32 on its inclined outer face. Though not illustrated, 3 elevating/lowering pins, which are substrate support pins, are provided penetrating the circular plate 34, for example. The substrate S is configured to be delivered to the spin chuck 2 with the cooperative action of the elevating/lowering pins and a substrate transfer means (not illustrated).

The substrate processing apparatus 1 includes a developing solution nozzle 23, a gas nozzle 4, a cleaning liquid nozzle 5, and a monitoring mechanism 6. The developing solution nozzle 23 includes a belt-like discharge port 23a (see FIG. 2) extending in the direction of the diameter of the substrate S held by the spin chuck 2. The developing solution nozzle 23 is connected to a developing solution supply system 25 via a developing solution supply channel 24, for example, a pipe. The developing solution supply system 25 includes a source of supply of a developing solution, a supply control device, and the like.

The developing solution nozzle 23 is supported by one end side of a nozzle arm 26 that is a support member. The other end side of the nozzle arm 26 is connected to a movable base 27 including an elevating/lowering mechanism (not illustrated). The movable base 27 is configured to be movable in the horizontal direction along a guide member 28 by means of a drive source (not illustrated) forming a movement mechanism. A nozzle standby portion 29 is a standby portion for the developing solution nozzle 23. In the nozzle standby portion 29, the tip end of the developing solution nozzle 23 is cleaned, for example.

The gas nozzle 4 is connected to a gas supply system 43 via a pipe 42. The gas supply system 43 includes a source of supply of a $N_2$ (nitrogen) gas, which is an inert gas, a supply control device, and the like. The gas nozzle 4 is provided on a nozzle holding portion 41, for example.

The cleaning liquid nozzle 5, which is a liquid nozzle, is connected to a cleaning liquid supply system 53 via a pipe 51. The cleaning liquid supply system 53 includes a source of supply of a cleaning liquid, a supply control device, and the like. The supply control device includes a pump and a valve capable of controlling the discharge flow rate, for example. The cleaning liquid nozzle 5 is provided on the nozzle holding portion 41, for example.

The nozzle holding portion 41 is provided at the tip end of a nozzle arm 44. The nozzle arm 44 is connected to a movable base 45 including an elevating/lowering mechanism. The movable base 45 is configured to be movable in the horizontal direction along the guide member 28 while not interfering with the developing solution nozzle 23, for example, by means of a drive source (not illustrated) forming a movement mechanism together with the elevating/lowering mechanism. A nozzle standby portion 46 is a standby portion for the cleaning liquid nozzle 5.

The monitoring mechanism 6 includes a high-precision camera. The monitoring mechanism 6 monitors the interface of a dry region constituting the boundary between a liquid layer and the dry region. The monitoring mechanism 6 outputs the results of monitoring to a controller 7.

The controller 7 is a computer that can execute a program. The controller 7 includes a program for executing each step of the operation to be performed by the substrate processing apparatus 1. The controller 7 is configured to output a control signal for controlling a movement mechanism for moving the developing solution supply system 25 and the developing solution nozzle 23, a movement mechanism for moving the gas supply system 43, the gas nozzle 4, and the cleaning liquid nozzle 5, the drive mechanism 22 for driving the spin chuck 2, the elevating/lowering portion 33 for the inner cup 32, or the like based on the program. The program is stored in a storage medium, such as a hard disk, a compact disc, a flash memory, a flexible disk, or a memory card, and is used by being installed on the computer from the storage medium.

Next, a series of methods for performing a developing process on the substrate S and then cleaning the substrate S using the substrate processing apparatus 1 will be described. First, the outer cup 31 and the inner cup 32 are located at the lowered positions, and the developing solution nozzle 23, the gas nozzle 4, and the cleaning liquid nozzle 5 wait at predetermined standby positions. In such a standby state, the substrate S is transferred by the substrate transfer means (not illustrated). The transferred substrate S has a surface coated with resist and further has been subjected to drawing. The substrate S is delivered to the spin chuck 2 with the cooperative action of the substrate transfer means and the elevating/lowering pins (not illustrated). In this example, a highly water-repellent material is used as the resist. Therefore, the static contact angle of the surface of the substrate S with respect to water is 90 degrees, for example.

The outer cup 31 and the inner cup 32 are set at the elevated positions. A developing solution is supplied onto the substrate S from the developing solution nozzle 23. Herein, the developing solution is supplied using a known method. In this example, the discharge port 23a of the developing solution nozzle 23 is set at a position several millimeters higher than the surface of the substrate S, for example. After that, the substrate S is rotated at a rotational speed of 1000 to 1200 rpm, for example. In the state where the substrate S is rotated, the developing solution nozzle 23 is moved in the direction of the radius of rotation of the substrate S, that is, from the outer side to the center side of the substrate S while a developing solution is discharged from the discharge port 23a in a belt-like manner. The developing solution nozzle 23 may also be moved from the center side to the outer side of the substrate S, or oscillated.

The developing solution discharged in a belt-like manner from the discharge port 23a is continuously supplied to a region from the outer side to the inner side of the substrate S. Accordingly, the developing solution is supplied to the entire surface of the substrate S in a spiral manner. With a centrifugal force acting on the rotating substrate S, the developing solution expands outward along the surface of the substrate S, and consequently, a thin liquid film is formed on the surface of the substrate S. Then, a soluble portion of the resist dissolves in the developing solution, while an insoluble portion of the resist to form a pattern thereafter remains.

Next, replacing the developing solution nozzle 23, the cleaning liquid nozzle 5 is arranged above the central portion of the substrate S. Immediately after the developing solution nozzle 23 has stopped the supply of the developing solution, a cleaning liquid is promptly discharged from the cleaning liquid nozzle 5 to clean the surface of the substrate S. After the developing solution is washed away with the cleaning liquid, the surface of the substrate S should be dried.

As a method for drying the surface of the substrate S, a spin drying method is known that rotates the substrate S to remove the cleaning liquid with a centrifugal force. However, due to the development step, the surface of the substrate S has both a portion where a resist pattern is formed and a portion where a resist pattern is not formed. The portion where the resist pattern is formed and the portion where the resist pattern is not formed differ in the degree of hydrophilicity of the surface with respect to the cleaning liquid.

Therefore, when the spin drying method is used, the drying time would differ between the portions with different degrees of hydrophilicity. Thus, the boundary between the liquid film of the cleaning liquid and the dry region where the liquid film has been removed would be disturbed, with the result that the liquid film may fall apart into droplets and the droplets remain on the substrate S. If the residual droplets are minute droplets, such droplets are difficult to be shaken off with a centrifugal force, and thus will remain on the substrate S. The residual droplets in turn form a reaction product, such as a watermark, causing defects.

To suppress the generation of such defects resulting from the residue of minute droplets, a combination drying method may be used that combines the supply of a cleaning liquid and the injection of a dry gas. The combination drying method includes:

(1) supplying a cleaning liquid to the center of a substrate being rotated to spread the cleaning liquid over the entire surface of the substrate, (2) while the substrate is rotated, moving the landing position of the cleaning liquid on the substrate surface from the center side to the peripheral edge side of the substrate by a predetermined distance and also discharging a dry gas to the center of the substrate to form a dry region in the central portion of the substrate, and (3) while the substrate is rotated, forming an interface of the dry region by maintaining a state in which the landing position of the cleaning liquid and the landing position of the dry gas on the substrate surface are separated from each other by a constant distance, and further moving the interface of the dry region to the peripheral edge side of the substrate to expand the dry region.

It should be noted that the "interface of the dry region" refers to the aforementioned boundary between the liquid film and the dry region.

In the combination drying method, along with the movement of the landing position of the cleaning liquid and the landing position of the dry gas to the peripheral edge side of the substrate, the interface of the dry region also moves to the peripheral edge side of the substrate. Thus, the dry region formed in the central portion of the substrate also expands outward. As the interface of the dry region is actively formed and moved, the disturbance of the interface of the dry region can be suppressed, and thus, a residue of minute droplets can be prevented, which would otherwise be generated due to the falling apart of the liquid film. Consequently, it is expected that the generation of defects resulting from a residue of minute droplets is suppressed.

Figure 3:
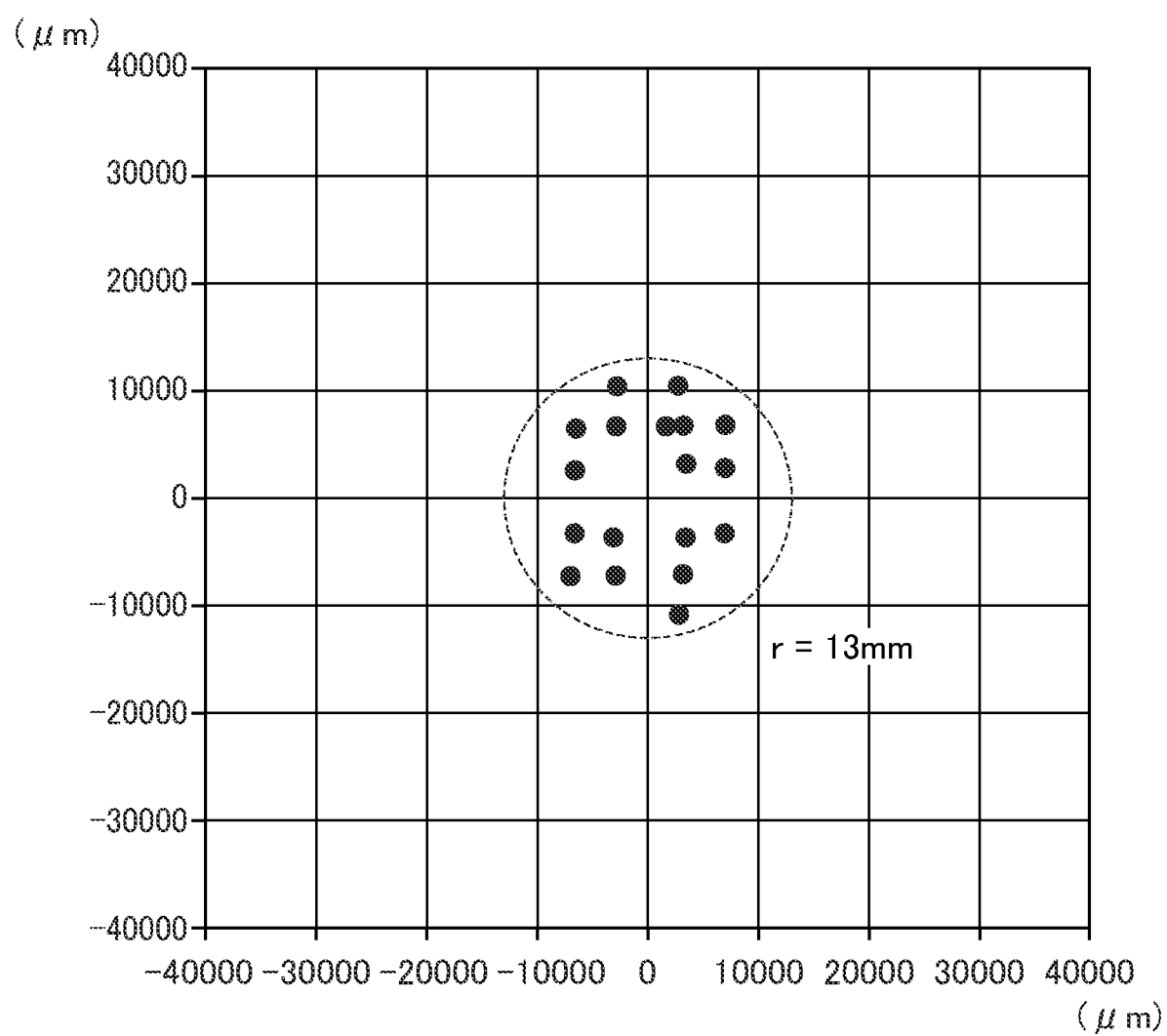
FIG. 3 is a view for illustrating a substrate processing method that uses the substrate processing apparatus illustrated in FIG. 1.

A substrate, which has a resist pattern formed thereon through resist application, drawing, and a development process, was cleaned and dried with the combination drying method, and was then inspected and observed for the presence of detects. FIG. 3 illustrates the positions of the generated defects confirmed through the inspection and observation for the presence of detects. The defects have been generated in a region on the inner side of a circle with a radius of about 13 mm from the center of the substrate.

The size and shape of a dry region initially formed in the center of the substrate with the combination drying method is a circle with a radius of about 13 mm. That is, a region for forming a dry region is a circle with a radius of about 13 mm. The time from when a dry region starts to be generated with a dry gas blown thereto to when the dry region becomes a circle with a radius of about 13 mm is about 0.2 sec. After the dry region has become a circle with a radius of about 13 mm, the interface of the dry region is moved to the peripheral edge side of the substrate while a state in which the landing position of the cleaning liquid and the landing position of the dry gas are separated from each other by a constant distance is maintained, so that the dry region is expanded. That is, a region for expanding the dry region is a circle with a radius of greater than or equal to 13 mm.

Figure 4:
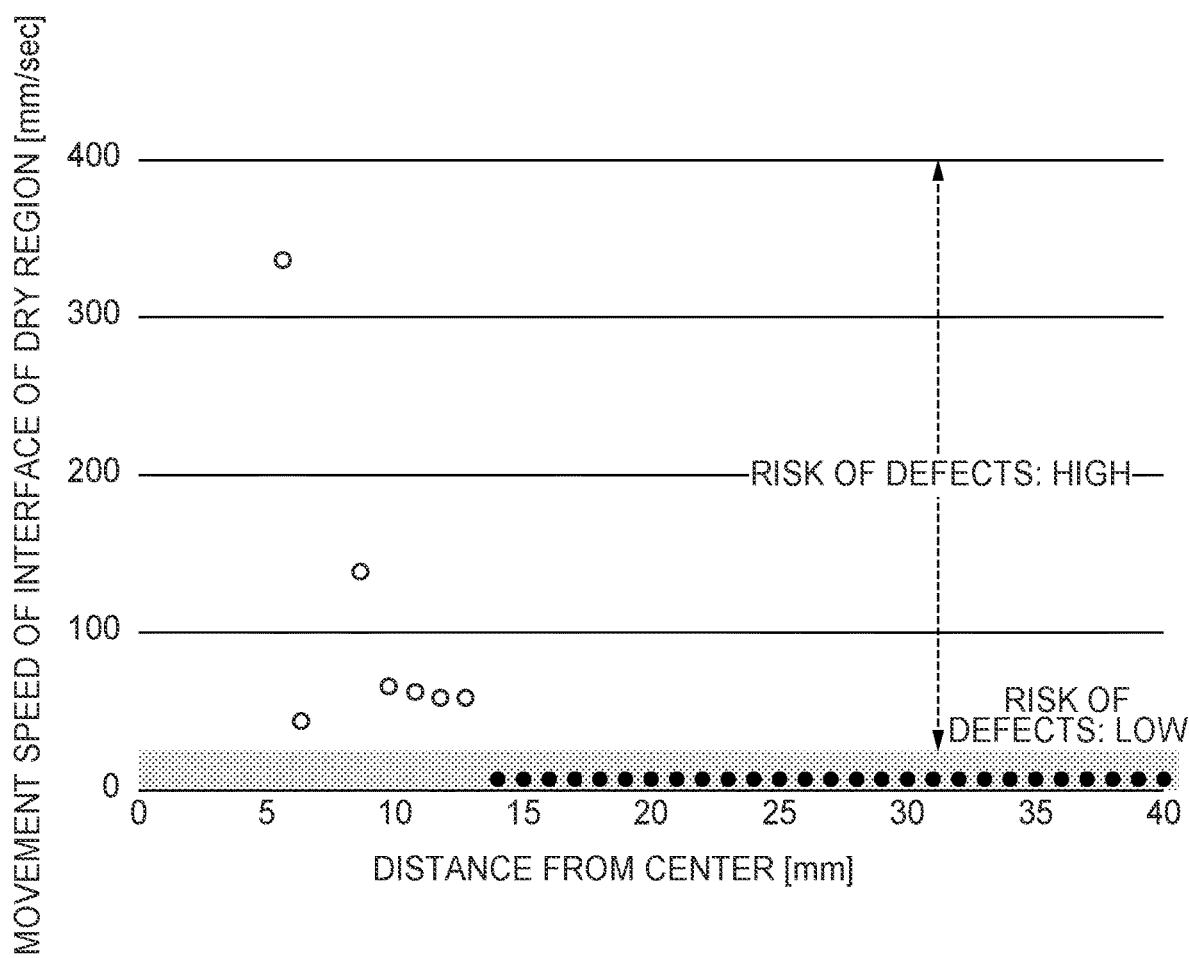
FIG. 4 is a chart for illustrating a substrate processing method that uses the substrate processing apparatus illustrated in FIG. 1.

FIG. 4 illustrates the results obtained by taking a video of the expanding dry region and calculating the movement speed of the interface of the dry region through analysis of the video. The movement speed of the interface is over 50 mm/sec on the inner side of the circle with a radius of 13 mm from the center of the substrate, that is, in the region for forming the dry region. The movement speed of the interface is 7 mm/sec on the outer side of the circle with a radius of 13 mm from the center of the substrate, that is, in the region for expanding the dry region.

Figure 5:
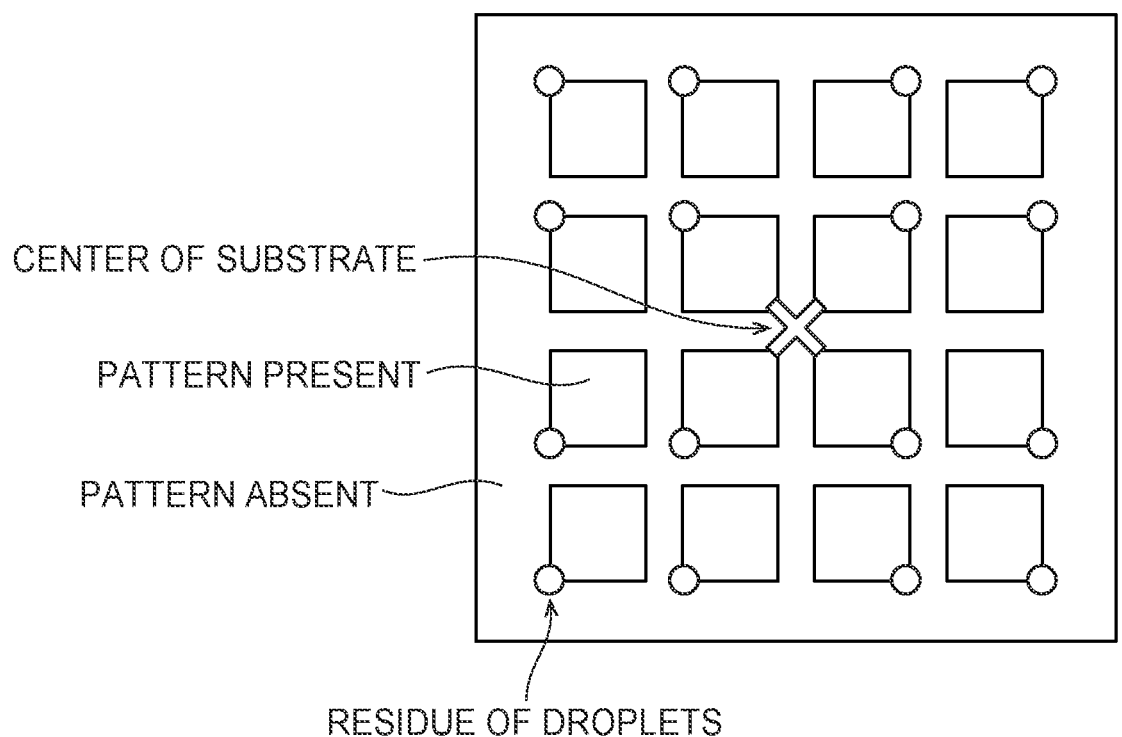
FIG. 5 is a view for illustrating a substrate processing method that uses the substrate processing apparatus illustrated in FIG. 1.

The movement speed of the interface of the dry region is much faster in the region for initially forming the dry region than in the region for expanding the dry region. As illustrated in FIG. 5, there is a high risk that droplets may remain at the position where the degree of hydrophilicity greatly changes, and such a risk is considered to further increase if the interface of the dry region passes through the position at a speed greater than or equal to a given speed.

Thus, the present embodiment provides a method for suppressing the generation of defects resulting from a residue of minute droplets by suppressing the movement speed of the interface of the dry region. The nozzle holding portion 41 of the present embodiment will be described with reference to FIG. 6. The nozzle holding portion 41 holds the gas nozzle 4 and the cleaning liquid nozzle 5.

The cleaning liquid nozzle 5 is configured to be moved by an actuator 52. The actuator 52 controls the cleaning liquid nozzle 5 to change the cleaning liquid injection direction in response to a control signal output from the controller 7. Next, a substrate processing method of the present embodiment will be described with reference to FIG. 7. The substrate processing method according to the present embodiment includes a liquid layer forming step, a dry region forming step, and a dry region expanding step.

Hereinafter, the details of the substrate processing method according to the present embodiment will be described.

Step 1 (i.e., a liquid layer forming step): A substrate S, which has a resist pattern formed thereon through resist application, drawing, and a development process, is prepared. The substrate S is rotated and a cleaning liquid is supplied thereto from the cleaning liquid nozzle 5 to form a liquid layer W (see FIG. 7A). More specifically, the nozzle holding portion 41 is moved to allow the cleaning liquid nozzle 5 to be arranged opposite the central portion of the substrate S. The position of the tip end of the cleaning liquid nozzle 5 is set at a level of 15 mm, for example, from the surface of the substrate S. The spin chuck 2 is rotated with a number of revolutions of 1000 rpm, for example. Pure water, for example, is discharged as the cleaning liquid to the central portion of the substrate S from the cleaning liquid nozzle 5 at a flow rate of 250 ml/minute for 5 seconds. Accordingly, the cleaning liquid expands from the central portion to the peripheral edge of the substrate S with a centrifugal force so that the developing solution is washed away with the cleaning liquid. It should be noted that the central portion of the substrate S means the center point of the substrate S and its vicinity.

Figure 7A:
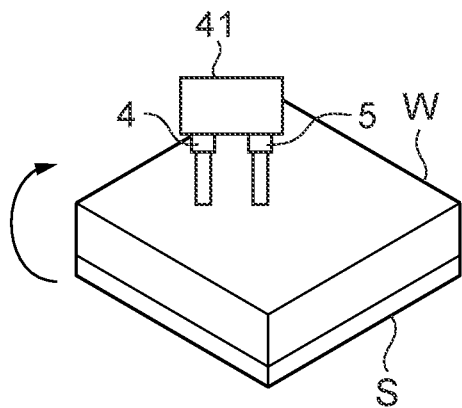
FIG. 7A is a view for illustrating a substrate processing method that uses the substrate processing apparatus illustrated in FIG. 1.
Figure 7B:
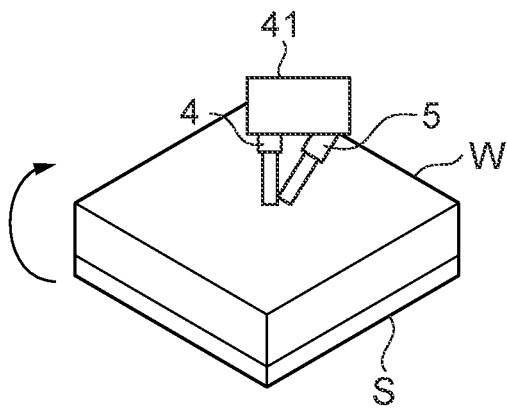
FIG. 7B is a view for illustrating a substrate processing method that uses the substrate processing apparatus illustrated in FIG. 1.
Figure 7C:
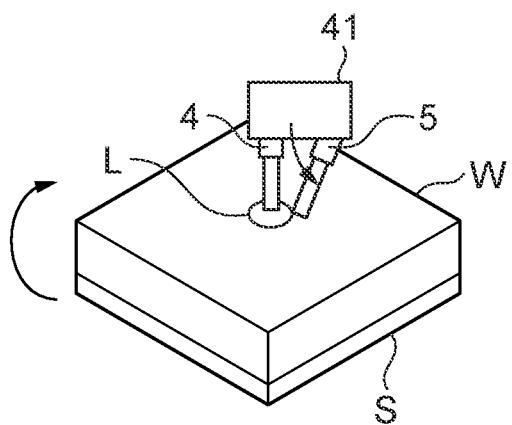
FIG. 7C is a view for illustrating a substrate processing method that uses the substrate processing apparatus illustrated in FIG. 1.
Figure 7D:
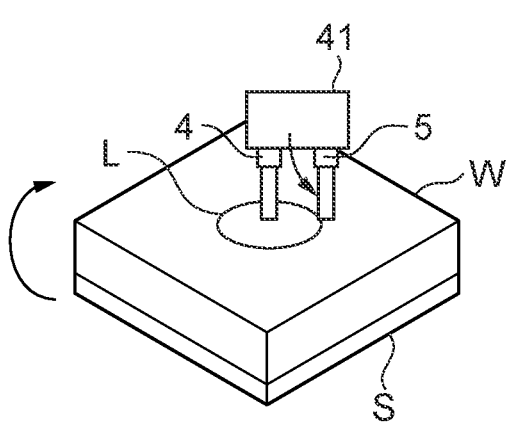
FIG. 7D is a view for illustrating a substrate processing method that uses the substrate processing apparatus illustrated in FIG. 1.

Step 2 (i.e., a dry region forming step): As illustrated in FIG. 7B, the nozzle holding portion 41 is moved to allow the gas nozzle 4 to be arranged opposite the central portion of the substrate S. The cleaning liquid nozzle 5 is moved so that a cleaning liquid injected therefrom is directed to the outer side of the central portion of the substrate S and on the outer side of a gas injected from the gas nozzle 4. That is, the tip end of the cleaning liquid nozzle 5 is inclined at an angle of greater than 0 degree and less than 90 degrees with respect to a direction perpendicular to the substrate, for example. In the state of FIG. 7B, a gas is injected from the gas nozzle 4, and a cleaning liquid is injected from the cleaning liquid nozzle 5. Next, as illustrated in FIG. 7C, the cleaning liquid nozzle 5 is moved to allow the cleaning liquid injection direction of the cleaning liquid nozzle 5 to be away from the gas injection direction of the gas nozzle 4. The oscillation speed is adjusted to allow the movement speed of the interface L of the dry region to be 7 mm/sec. The movement speed of the interface L of the dry region may also be adjusted by feeding back the monitoring results of the monitoring mechanism 6, for example. The movement speed of the interface L of the dry region is desirably less than 50 mm/sec, or more desirably less than 20 mm/sec. As illustrated in FIG. 7D, the cleaning liquid injection direction of the cleaning liquid nozzle 5 is gradually moved outward so as to adjust the dry region to become a circle with a radius of about 13 mm.

Figure 7E:
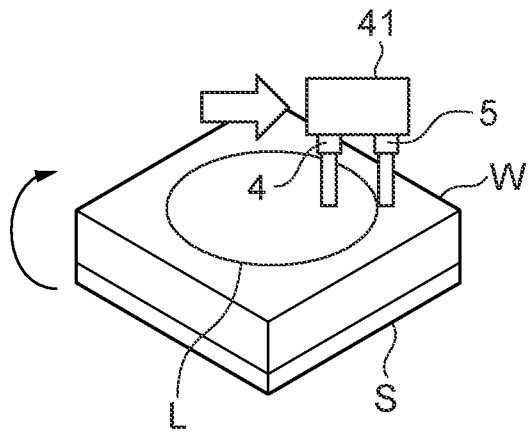
FIG. 7E is a view for illustrating a substrate processing method that uses the substrate processing apparatus illustrated in FIG. 1.

Step 3 (i.e., a dry region expanding step): As illustrated in FIG. 7E, a state in which the gas landing position of the gas injected from the gas nozzle 4 on the substrate S and the cleaning liquid landing position of the cleaning liquid injected from the cleaning liquid nozzle 5 on the substrate S are separated from each other by a distance of about 15 mm is maintained, and the nozzle holding portion 41 is moved to the peripheral edge side of the substrate so as to expand the dry region. After the entire surface of the substrate S was dried, the surface was inspected and observed for the presence of defects. Then, it was confirmed that defects resulting from a residue of droplets were reduced.

First Modified Example

A nozzle holding portion 41A as a first modified example of the present embodiment will be described with reference to FIG. 8. The nozzle holding portion 41A holds a gas nozzle 4 and a cleaning liquid nozzle 5.

The cleaning liquid nozzle 5 is configured to be moved along the surface of the substrate S by an actuator 52A. The actuator 52A controls the cleaning liquid nozzle 5 to change the position of the cleaning liquid nozzle 5 in response to a control signal output from the controller 7. Next, a substrate processing method that uses the nozzle holding portion 41A as the first modified example will be described with reference to FIG. 9. The substrate processing method that uses the nozzle holding portion 41A according to the first modified example also includes a liquid layer forming step, a dry region forming step, and a dry region expanding step.

Hereinafter, the details of the substrate processing method according to the first modified example of the present embodiment will be described.

Step 1 (i.e., a liquid layer forming step): A substrate S, which has a resist pattern formed thereon through resist application, drawing, and a development process, is prepared. The substrate S is rotated and a cleaning liquid is supplied thereto from the cleaning liquid nozzle 5 to form a liquid layer (see FIG. 9A). More specifically, the nozzle holding portion 41A is moved to allow the cleaning liquid nozzle 5 to be arranged opposite the central portion of the substrate S. The position of the cleaning liquid nozzle 5 is set at a level of 15 mm, for example, from the surface of the substrate S. The spin chuck 2 is rotated with a number of revolutions of 1000 rpm, for example. Pure water, for example, is discharged as the cleaning liquid to the central portion of the substrate S from the cleaning liquid nozzle 5 at a flow rate of 250 ml/minute for 5 seconds. Accordingly, the cleaning liquid expands from the central portion to the peripheral edge of the substrate S with a centrifugal force so that the developing solution is washed away with the cleaning liquid. It should be noted that the central portion of the substrate S means the center point of the substrate S and its vicinity.

Figure 9A:
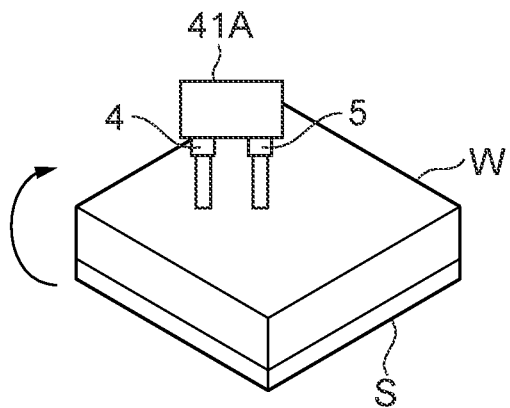
FIG. 9A is a view for illustrating a substrate processing method that uses the nozzle holding portion illustrated in FIG. 8.
Figure 9B:
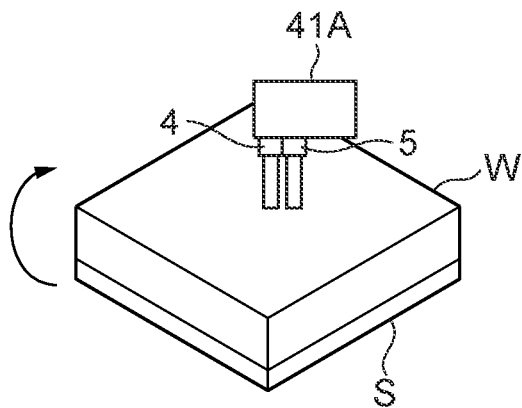
FIG. 9B is a view for illustrating a substrate processing method that uses the nozzle holding portion illustrated in FIG. 8.
Figure 9C:
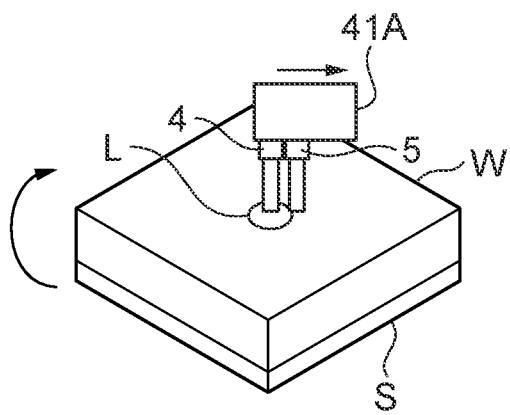
FIG. 9C is a view for illustrating a substrate processing method that uses the nozzle holding portion illustrated in FIG. 8.
Figure 9D:
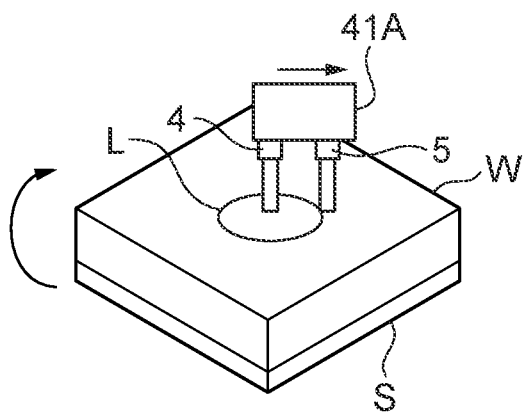
FIG. 9D is a view for illustrating a substrate processing method that uses the nozzle holding portion illustrated in FIG. 8.

Step 2 (i.e., a dry region forming step): As illustrated in FIG. 9B, the nozzle holding portion 41A is moved to allow the gas nozzle 4 to be arranged opposite the central portion of the substrate S. The cleaning liquid nozzle 5 is arranged to allow a cleaning liquid injected therefrom to be arranged on the outer side of the central portion of the substrate S and on the outer side of a gas injected from the gas nozzle 4. In the state of FIG. 9B, a gas is injected from the gas nozzle 4, and a cleaning liquid is injected from the cleaning liquid nozzle 5. Next, as illustrated in FIG. 9C, the cleaning liquid nozzle 5 is moved in the horizontal direction with respect to the substrate S so as to allow the cleaning liquid injection position of the cleaning liquid nozzle 5 to be away from the gas injection position of the gas nozzle 4. The movement speed is adjusted to allow the movement speed of the interface L of the dry region to be 7 mm/sec. As illustrated in FIG. 9D, the cleaning liquid injection position of the cleaning liquid nozzle 5 is gradually moved outward in the horizontal state with respect to the substrate S so as to adjust the dry region to become a circle with a radius of about 13 mm.

Figure 9E:
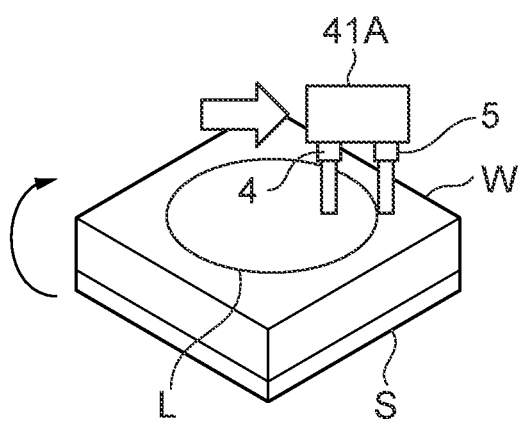
FIG. 9E is a view for illustrating a substrate processing method that uses the nozzle holding portion illustrated in FIG. 8.

Step 3 (i.e., a dry region expanding step): As illustrated in FIG. 9E, a state in which the gas landing position of the gas injected from the gas nozzle 4 on the substrate S and the cleaning liquid landing position of the cleaning liquid injected from the cleaning liquid nozzle 5 on the substrate S are separated from each other by a distance of about 15 mm is maintained, and the nozzle holding portion 41A is moved to the peripheral edge side of the substrate so as to expand the dry region. After the entire surface of the substrate S was dried, the surface was inspected and observed for the presence of detects. Then, it was confirmed that defects resulting from a residue of droplets were reduced.

Second Modified Example

A nozzle holding portion 41B as a second modified example of the present embodiment will be described with reference to FIG. 10. The nozzle holding portion 41B holds a gas nozzle 4 and cleaning liquid nozzles 5Ba, 5Bb, 5Bc, 5Bd, 5Be, and 5Bf. In the second modified example, a single gas nozzle 4 and six cleaning liquid nozzles 5Ba, 5Bb, 5Bc, 5Bd, 5Be, and 5Bf are arranged in a row.

The cleaning liquid nozzle 5Ba is configured such that its injection and stop of a cleaning liquid are adjusted by opening and closing a valve 52Ba. The cleaning liquid nozzle 5Bb is configured such that its injection and stop of a cleaning liquid are adjusted by opening and closing a valve 52Bb. The cleaning liquid nozzle 5Bc is configured such that its injection and stop of a cleaning liquid are adjusted by opening and closing a valve 52Bc. The cleaning liquid nozzle 5Bd is configured such that its injection and stop of a cleaning liquid are adjusted by opening and closing a valve 52Bd. The cleaning liquid nozzle 5Be is configured such that its injection and stop of a cleaning liquid are adjusted by opening and closing a valve 52Be. The cleaning liquid nozzle 5Bf is configured such that its injection and stop of a cleaning liquid are adjusted by opening and closing a valve 52Bf. Each of the valves 52Ba, 52Bb, 52Bc, 52Bd, 52Be, and 52Bf for the cleaning liquid nozzles is opened or closed in response to a control signal output from the controller 7 so as to adjust the injection of a cleaning liquid from the corresponding cleaning liquid nozzle. Next, a substrate processing method that uses the nozzle holding portion 41B as the second modified example will be described with reference to FIG. 11. The substrate processing method that uses the nozzle holding portion 41B according to the second modified example also includes a liquid layer forming step, a dry region forming step, and a dry region expanding step.

Hereinafter, the details of the substrate processing method according to the second modified example of the present embodiment will be described.

Step 1 (i.e., a liquid layer forming step): A substrate S, which has a resist pattern formed thereon through resist application, drawing, and a development process, is prepared. The substrate S is rotated and a cleaning liquid is supplied thereto from each of the cleaning liquid nozzles 5Ba, 5Bb, 5Bc, 5Bd, 5Be, and 5Bf to form a liquid layer W (see FIG. 11A). More specifically, the nozzle holding portion 41B is moved to allow the cleaning liquid nozzles 5Ba, 5Bb, 5Bc, 5Bd, 5Be, and 5Bf to be arranged opposite the central portion of the substrate S. The positions of the tip ends of the cleaning liquid nozzles 5Ba, 5Bb, 5Bc, 5Bd, 5Be, 5Bf are set at a level of 15 mm, for example, from the surface of the substrate S. The spin chuck 2 is rotated with a number of revolutions of 1000 rpm, for example. Pure water, for example, is discharged as the cleaning liquid to the central portion of the substrate S from each of the cleaning liquid nozzles 5Ba, 5Bb, 5Bc, 5Bd, 5Be, and 5Bf at a flow rate of 250 ml/minute, for example, for 5 seconds, for example. Accordingly, the cleaning liquid expands from the central portion to the peripheral edge of the substrate S with a centrifugal force so that the developing solution is washed away with the cleaning liquid. It should be noted that the central portion of the substrate S means the center point of the substrate S and its vicinity.

Figure 11A:
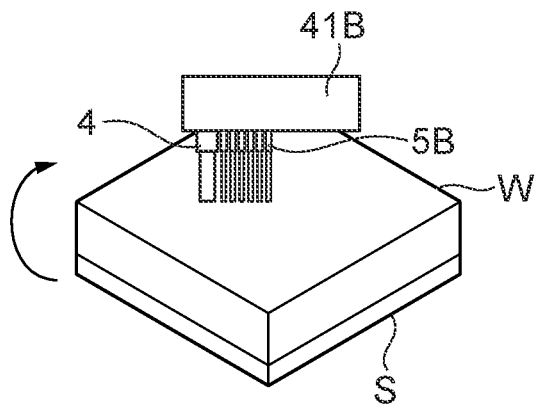
FIG. 11A is a view for illustrating a substrate processing method that uses the nozzle holding portion illustrated in FIG. 10.
Figure 11B:
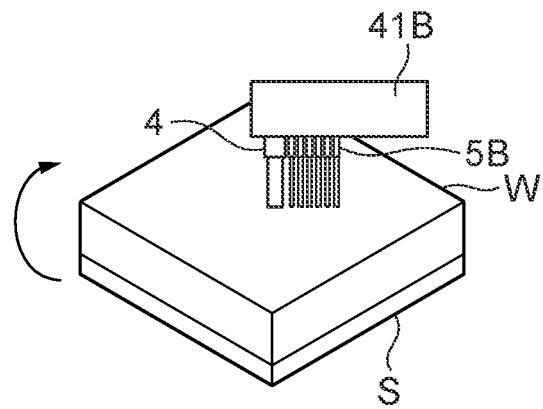
FIG. 11B is a view for illustrating a substrate processing method that uses the nozzle holding portion illustrated in FIG. 10.
Figure 11C:
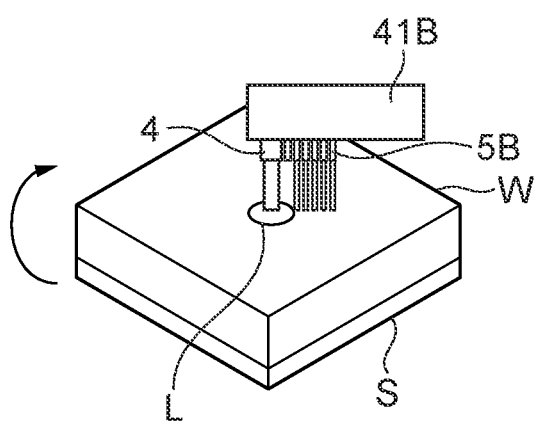
FIG. 11C is a view for illustrating a substrate processing method that uses the nozzle holding portion illustrated in FIG. 10.
Figure 11D:
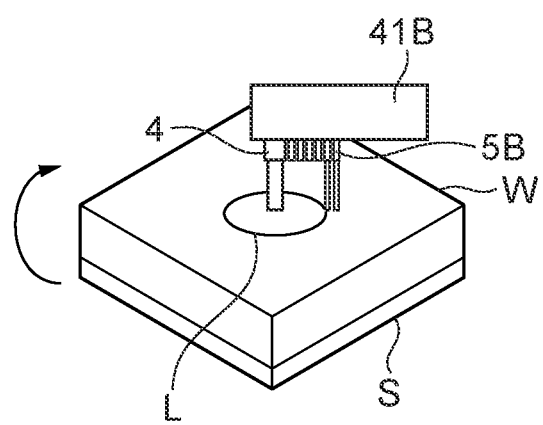
FIG. 11D is a view for illustrating a substrate processing method that uses the nozzle holding portion illustrated in FIG. 10.

Step 2 (i.e., a dry region forming step): As illustrated in FIG. 11B, the nozzle holding portion 41B is moved to allow the gas nozzle 4 to be arranged opposite the central portion of the substrate S. Each of the cleaning liquid nozzles 5Ba, 5Bb, 5Bc, 5Bd, 5Be, and 5Bf is arranged to allow a cleaning liquid injected therefrom to be arranged on the outer side of the central portion of the substrate S and on the outer side of a gas injected from the gas nozzle 4. In the state of FIG. 11B, a gas is injected from the gas nozzle 4, and a cleaning liquid is injected from each of the cleaning liquid nozzles 5Ba, 5Bb, 5Bc, 5Bd, 5Be, and 5Bf. Next, as illustrated in FIG. 11C, the injection of the cleaning liquid from the cleaning liquid nozzles 5Ba, 5Bb, 5Bc, 5Bd, 5Be, and 5Bf is sequentially stopped so as to allow the cleaning liquid injection positions of the cleaning liquid nozzles 5Ba, 5Bb, 5Bc, 5Bd, 5Be, and 5Bf to be away from the gas injection position of the gas nozzle 4. More specifically, the injection of the cleaning liquid from the cleaning liquid nozzle 5Ba is stopped first, and next, the injection of the cleaning liquid from the cleaning liquid nozzle 5Bb is stopped, the injection of the cleaning liquid from the cleaning liquid nozzle 5Bc is stopped, and the injection of the cleaning liquid from the cleaning liquid nozzle 5Bd is stopped. The speed of sequentially stopping the injection of the cleaning liquid is adjusted to allow the movement speed of the interface L of the dry region to be 7 mm/sec. As illustrated in FIG. 11D, the cleaning liquid injection positions of the cleaning liquid nozzles 5Ba, 5Bb, 5Bc, 5Bd, 5Be, and 5Bf are gradually moved outward so as to adjust the dry region to become a circle with a radius of about 13 mm.

Figure 11E:
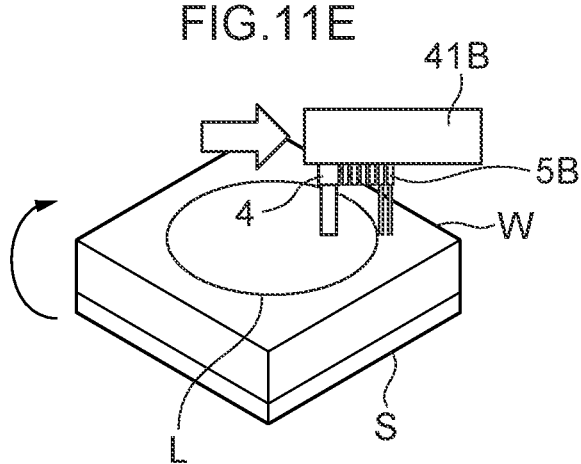
FIG. 11E is a view for illustrating a substrate processing method that uses the nozzle holding portion illustrated in FIG. 10.

Step 3 (i.e., a dry region expanding step): As illustrated in FIG. 11E, a state in which the gas landing position of the gas injected from the gas nozzle 4 on the substrate S and the cleaning liquid landing position of the cleaning liquid injected from each of the cleaning liquid nozzles 5Be and 5Bf on the substrate S are separated from each other by a distance of about 15 mm is maintained, and the nozzle holding portion 41B is moved to the peripheral edge side of the substrate so as to expand the dry region. After the entire surface of the substrate S was dried, the surface was inspected and observed for the presence of detects. Then, it was confirmed that defects resulting from a residue of droplets were reduced.

Third Modified Example

Figure 12:
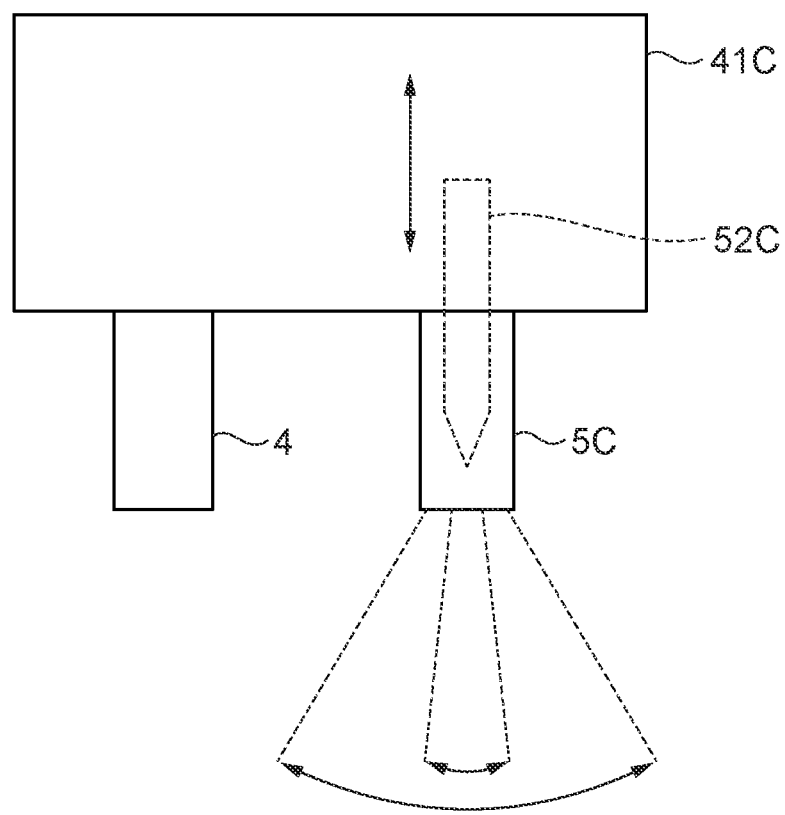
FIG. 12 is a view for illustrating a third modified example of the nozzle holding portion in FIG. 1.

A nozzle holding portion 41C as a third modified example of the present embodiment will be described with reference to FIG. 12. The nozzle holding portion 41C includes a gas nozzle 4 and a cleaning liquid nozzle 5C.

The cleaning liquid nozzle 5C is configured such that a oscillation state of the cleaning liquid nozzle 5C and/or the injection angle of a cleaning liquid injected from the tip end thereof is adjustable. The cleaning liquid nozzle 5C includes an injection angle adjustment member 52C. As the injection angle adjustment member 52C moves up and down, the angle of a cleaning liquid injected from the cleaning liquid nozzle 5C is adjusted. The injection angle adjustment member 52C controls the cleaning liquid nozzle 5C to change the angle of a cleaning liquid injected from the cleaning liquid nozzle 5C in response to a control signal output from the controller 7. Next, a substrate processing method that uses the nozzle holding portion 41C as the third modified example will be described with reference to FIG. 13. The substrate processing method that uses the nozzle holding portion 41A according to the third modified example also includes a liquid layer forming step, a dry region forming step, and a dry region expanding step.

Hereinafter, the details of the substrate processing method according to the third modified example of the present embodiment will be described.

Step 1 (i.e., a liquid layer forming step): A substrate S, which has a resist pattern formed thereon through resist application, drawing, and a development process, is prepared. The substrate S is rotated and a cleaning liquid is supplied thereto from the cleaning liquid nozzle 5C to form a liquid layer W (see FIG. 13A). More specifically, the nozzle holding portion 41C is moved to allow the cleaning liquid nozzle 5C to be arranged opposite the central portion of the substrate S. The position of the cleaning liquid nozzle 5C is set at a level of 15 mm, for example, from the surface of the substrate S. The spin chuck 2 is rotated with a number of revolutions of 1000 rpm, for example. Pure water, for example, is discharged as the cleaning liquid to the central portion of the substrate S from the cleaning liquid nozzle 5C at a flow rate of 250 ml/minute, for example, for 5 seconds, for example. Accordingly, the cleaning liquid expands from the central portion to the peripheral edge of the substrate S with a centrifugal force so that the developing solution is washed away with the cleaning liquid. It should be noted that the central portion of the substrate S means the center point of the substrate S and its vicinity.

Figure 13A:
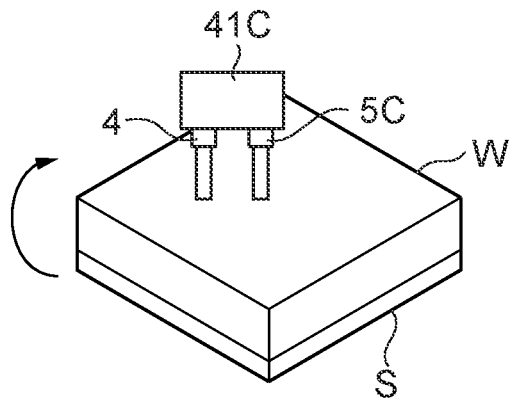
FIG. 13A is a view for illustrating a substrate processing method that uses the nozzle holding portion illustrated in FIG. 12.
Figure 13B:
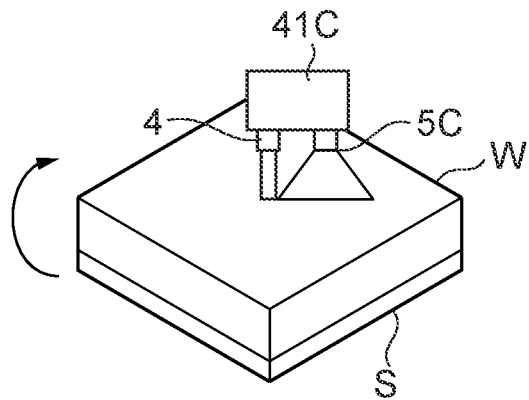
FIG. 13B is a view for illustrating a substrate processing method that uses the nozzle holding portion illustrated in FIG. 12.
Figure 13C:
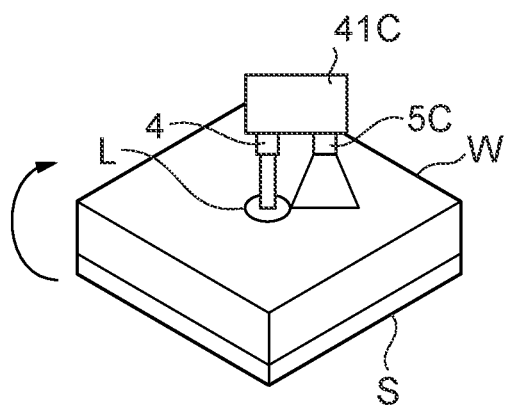
FIG. 13C is a view for illustrating a substrate processing method that uses the nozzle holding portion illustrated in FIG. 12.
Figure 13D:
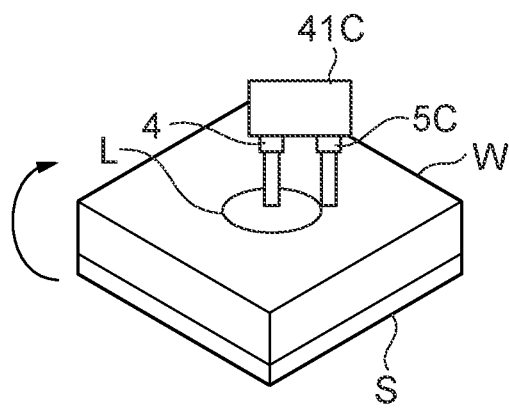
FIG. 13D is a view for illustrating a substrate processing method that uses the nozzle holding portion illustrated in FIG. 12.

Step 2 (i.e., a dry region forming step): As illustrated in FIG. 13B, the nozzle holding portion 41C is moved to allow the gas nozzle 4 to be arranged opposite the central portion of the substrate S. The angle of a cleaning liquid injected from the cleaning liquid nozzle 5C is adjusted to a wide angle so that the injected cleaning liquid is arranged on the outer side of the central portion of the substrate S and on the outer side of a gas injected from the gas nozzle 4. In the state of FIG. 13B, a gas is injected from the gas nozzle 4, and a cleaning liquid is injected from the cleaning liquid nozzle 5C. Next, as illustrated in FIG. 13C, the angle of the cleaning liquid injected from the cleaning liquid nozzle 5C is gradually made narrower so as to allow the cleaning liquid injection position of the cleaning liquid nozzle 5C to be away from the gas injection position of the gas nozzle 4. The speed of narrowing the cleaning liquid injection angle is adjusted to allow the movement speed of the interface L of the dry region to be 7 mm/sec. As illustrated in FIG. 13D, the cleaning liquid injection position of the cleaning liquid nozzle 5C is gradually moved outward so as to adjust the dry region to become a circle with a radius of about 13 mm.

Figure 13E:
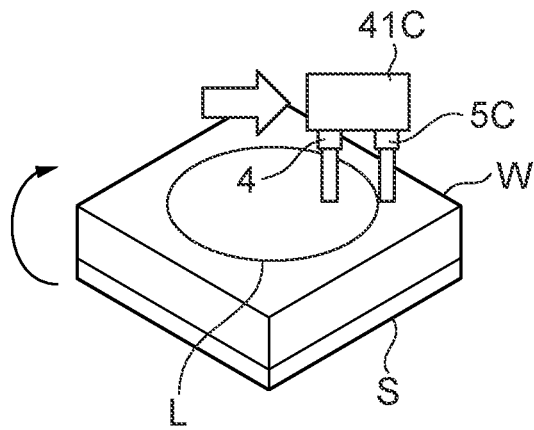
FIG. 13E is a view for illustrating a substrate processing method that uses the nozzle holding portion illustrated in FIG. 12.

Step 3 (i.e., a dry region expanding step): As illustrated in FIG. 13E, a state in which the gas landing position of the gas injected from the gas nozzle 4 on the substrate S and the cleaning liquid landing position of the cleaning liquid injected from the cleaning liquid nozzle 5C on the substrate S are separated from each other by a distance of about 15 mm is maintained, and the nozzle holding portion 41C is moved to the peripheral edge side of the substrate so as to expand the dry region. After the entire surface of the substrate S was dried, the surface was inspected and observed for the presence of detects. Then, it was confirmed that defects resulting from a residue of droplets were reduced.

In each step 2 described with reference to FIGS. 6 to 13, the movement speed of the interface L of the dry region is set to 7 mm/sec, but the movement speed is not limited thereto. The movement speed of the interface L of the dry region can be changed to be within a given range as long as no defects would ultimately be generated due to a residue of droplets. In each step 3 described with reference to FIGS. 6 to 13, the dry region is expanded in the state where the gas landing position and the cleaning liquid landing position are separated from each other by a distance of about 15 mm, but the separation distance can be changed as appropriate. In step 3, the injection of the gas may also be stopped.

As described above, the present embodiment provides the substrate processing apparatus 1 for cleaning and drying the substrate S as the substrate under processing, the substrate processing apparatus 1 including the cleaning liquid nozzle 5 that supplies a cleaning liquid onto the substrate under processing, the gas nozzle 4 that supplies a gas onto the substrate under processing, and the controller 7 that controls the state of supply of the cleaning liquid from the cleaning liquid nozzle 5 and the state of supply of the gas from the gas nozzle 4. The controller 7 causes the cleaning liquid nozzle 5 to supply a cleaning liquid onto the substrate under processing to form a cleaning liquid layer, and causes the gas nozzle 4 to supply a gas onto the substrate under processing to partially remove the cleaning liquid layer and thus form a first dry region on the substrate under processing (see FIGS. 7B, 9B, 11B, and 13B), and then expands the first dry region to form a second dry region by controlling the movement speed of the boundary between the cleaning liquid layer and the first dry region to be less than or equal to a predetermined speed (see FIGS. 7C and 7D, 9C, 9D, 11C, 11D, 13C, and 13D), and further expands the second dry region to form a third dry region (see FIGS. 7E, 9E, 11E, and 13E). The first dry region may be an extremely small region, for example, a region with a diameter of about 1 nm. It is also possible to expand the first dry region to generate the second dry region by controlling the movement speed of the boundary between the cleaning liquid layer and the first dry region to be less than or equal to a predetermined speed immediately after supplying a gas onto the substrate under processing from the gas nozzle 4.

As described above, the present embodiment provides a substrate processing method for cleaning and drying the substrate S as the substrate under processing, the method including supplying a cleaning liquid onto the substrate under processing to form a cleaning liquid layer, supplying a gas onto the substrate under processing to partially remove the cleaning liquid layer and thus generate a first dry region on the substrate under processing (see FIGS. 7B, 9B, 11B, and 13B), expanding the first dry region to generate a second dry region by controlling the movement speed of the boundary between the cleaning liquid layer and the first dry region to be less than or equal to a predetermined speed, (see FIGS. 7C, 7D, 9C, 9D, 11C, 11D, 13C, and 13D), and further expanding the second dry region to generate a third dry region (see FIGS. 7E, 9E, 11E, and 13E). The first dry region may be an extremely small region, for example, a region with a diameter of about 1 nm. It is also possible to expand the first dry region to generate the second dry region by controlling the movement speed of the boundary between the cleaning liquid layer and the first dry region to be less than or equal to a predetermined speed immediately after supplying a gas onto the substrate under processing from the gas nozzle 4.

Each of the first dry region, the second dry region, and the third dry region is formed by adjusting at least one of the liquid landing position of the cleaning liquid on the substrate under processing and the gas landing position of the gas on the substrate under processing.

Second Embodiment

Another substrate processing method that uses the nozzle holding portion 41 according to the present embodiment will be described with reference to FIG. 14. The substrate processing method according to the present embodiment includes a liquid layer forming step, a dry region forming step, and a dry region expanding step. It should be noted that the configuration of the substrate processing apparatus 1 according to the present embodiment is similar to that of the first embodiment.

Hereinafter, the details of the substrate processing method according to the present embodiment will be described.

Step 1 (i.e., a liquid layer forming step): A substrate S, which has a resist pattern formed thereon through resist application, drawing, and a development process, is prepared. The substrate S is rotated, and a cleaning liquid is supplied thereto from the cleaning liquid nozzle 5 to form a liquid layer W (see FIG. 14A). More specifically, the nozzle holding portion 41 is moved to allow the cleaning liquid nozzle 5 to be arranged opposite the central portion of the substrate S. The position of the cleaning liquid nozzle 5 is set at a level of 15 mm, for example, from the surface of the substrate S. The spin chuck 2 is rotated with a number of revolutions of 1000 rpm, for example. Pure water, for example, is discharged as the cleaning liquid to the central portion of the substrate S from the cleaning liquid nozzle 5 at a flow rate of 250 ml/minute, for example, for 5 seconds, for example. Accordingly, the cleaning liquid expands from the central portion to the peripheral edge of the substrate S with a centrifugal force so that the developing solution is washed away with the cleaning liquid. It should be noted that the central portion of the substrate S means the center point of the substrate S and its vicinity.

Figure 14A:
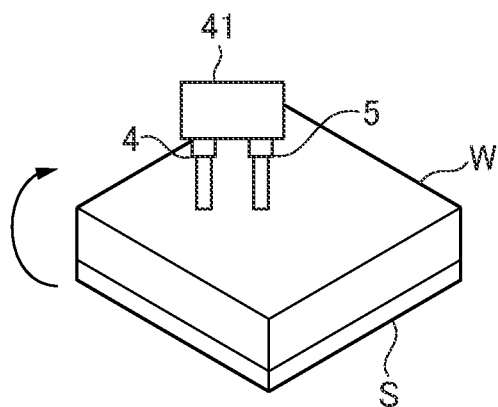
FIG. 14A is a view for illustrating a substrate processing method according to a second embodiment.
Figure 14B:
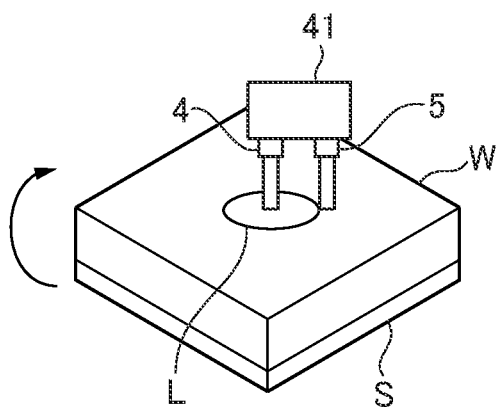
FIG. 14B is a view for illustrating the substrate processing method according to the second embodiment.
Figure 14C:
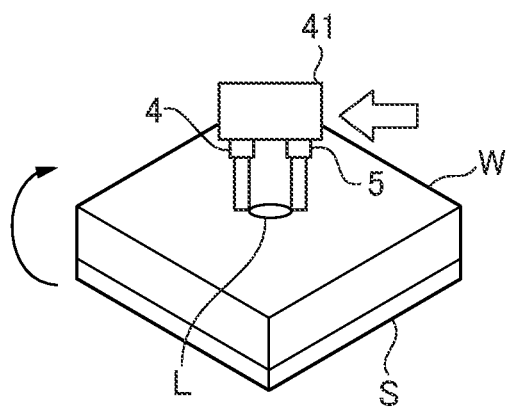
FIG. 14C is a view for illustrating the substrate processing method according to the second embodiment.

Step 2 (i.e., a dry region forming step): As illustrated in FIG. 14B, the nozzle holding portion 41 is moved to allow the gas nozzle 4 to be arranged opposite the central portion of the substrate S. In the state of FIG. 14B, a gas is injected from the gas nozzle 4, and a cleaning liquid is injected from the cleaning liquid nozzle 5. The gas is injected to the center of the substrate S, and the cleaning liquid is injected to a position away from the center of the substrate S by about 15 mm so that a circular dry region with a radius of about 13 mm is formed on the central portion of the substrate S. Next, as illustrated in FIG. 14C, the landing position of the cleaning liquid is moved to the center side of the substrate S by 10 mm so as to adjust the circular dry region to have a radius of about 3 mm.

Figure 14D:
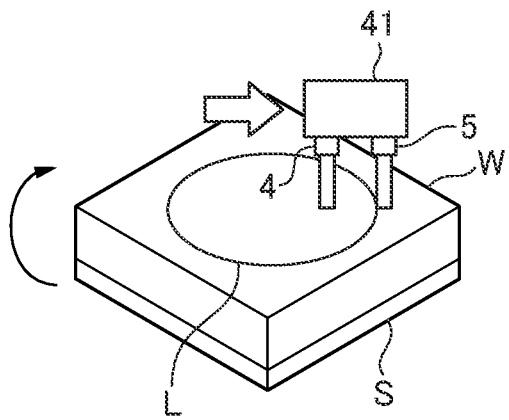
FIG. 14D is a view for illustrating the substrate processing method according to the second embodiment.

Step 3 (i.e., a dry region expanding step): As illustrated in FIG. 14D, a state in which the gas landing position of the gas injected from the gas nozzle 4 on the substrate S and the cleaning liquid landing position of the cleaning liquid injected from the cleaning liquid nozzle 5 on the substrate S are separated from each other by a distance of about 15 mm is maintained, and the nozzle holding portion 41 is moved to the peripheral edge side of the substrate so as to expand the dry region. After the entire surface of the substrate S was dried, the surface was inspected and observed for the presence of detects. Then, it was confirmed that defects resulting from a residue of droplets were reduced.

In step 2 described with reference to FIG. 14B, the dry region is expanded in the state where the gas landing position and the cleaning liquid landing position are separated from each other by a distance of about 15 mm, but the separation distance can be changed as appropriate. The radius of the dry region formed in the central portion of the substrate S is not limited to about 13 mm. After the dry region is formed, the injection of the gas may also be stopped. In step 2, the movement distance of the cleaning liquid landing position to the center side of the substrate S is not limited to about 10 mm. The radius of the adjusted dry region is not limited to about 3 mm. In step 3, the dry region is expanded in the state where the gas landing position and the cleaning liquid landing position are separated from each other by a distance of about 15 mm, but the separation distance can be changed as appropriate.

As described above, the present embodiment provides the substrate processing apparatus 1 for cleaning and drying the substrate under processing, the substrate processing apparatus 1 including the cleaning liquid nozzle 5 that supplies a cleaning liquid onto the substrate under processing, the gas nozzle 4 that supplies a gas onto the substrate under processing, and the controller 7 that controls the state of supply of the cleaning liquid from the cleaning liquid nozzle 5 and the state of supply of the gas from the gas nozzle 4. The controller 7 causes the cleaning liquid nozzle 5 to supply a cleaning liquid onto the substrate under processing to form a cleaning liquid layer, and causes the gas nozzle 4 to supply a gas onto the substrate under processing to partially remove the cleaning liquid layer and thus generate a first dry region on the substrate under processing (see FIG. 14B), and then reduces the first dry region to generate a fourth dry region (see FIG. 14C), and further expands the fourth dry region to generate a fifth dry region (see FIG. 14D).

As described above, the present embodiment provides a substrate processing method for cleaning and drying the substrate S as the substrate under processing, the method including supplying a cleaning liquid onto the substrate under processing to from a cleaning liquid layer, and supplying a gas onto the substrate under processing to partially remove the cleaning liquid layer and thus generate a first dry region on the substrate under processing (see FIG. 14(B)), and then reducing the first dry region to generate a fourth dry region (see FIG. 14(C)), and further expanding the fourth dry region to generate a fifth dry region (see FIG. 14(D)).

It is also possible to reduce the first dry region to generate the fourth dry region and further expand the fourth dry region to generate the fifth dry region by controlling the movement speed of the boundary between the cleaning liquid layer and the first dry region to be less than or equal to a predetermined speed.

Each of the first dry region, the fourth dry region, and the fifth dry region is formed by adjusting at least one of the liquid landing position of the cleaning liquid on the substrate under processing and the gas landing position of the gas on the substrate under processing.

In the description of the embodiments and the modified examples, the liquid landing position may also be adjusted based on the flow rate of the discharged cleaning liquid, for example. The gas landing position may also be adjusted based on the flow rate of the discharged gas, for example.

Although the embodiments have been described with reference to specific examples, the present disclosure is not limited thereto. Such specific examples are, even when some design changes are made thereto as appropriate by one of ordinary skill in the art, also included in the scope of the present disclosure as long as the resulting design includes the features of the present disclosure. The components, their arrangement, conditions, shapes, and the like of each of the aforementioned specific examples are not limited to those exemplarily illustrated above, and can be changed as appropriate. A combination of the components of each of the aforementioned specific examples can be changed as appropriate unless any technical contradiction occurs.

What is claimed is:

1. A substrate processing apparatus for cleaning and drying a substrate under processing, comprising:
   a liquid nozzle that supplies a liquid onto the substrate under processing to form a liquid layer;
   a gas nozzle that supplies a gas onto the substrate under processing to form a dry region;
   a controller configured to control the liquid nozzle and the gas nozzle; and
   wherein:
   the controller is configured to carry out the substrate processing including:
   (1) a liquid layer forming step to form and expand the liquid layer on the substrate;
   (2) a dry region forming step to form a dry region and to expand the dry region to a predetermined size; and
   (3) a dry region expanding step to further expand the dry region from the predetermined size, and
   wherein the controller is configured to, in the dry region forming step, while causing the liquid nozzle to supply the liquid and causing the gas nozzle to supply the gas, adjust at least one of a liquid landing position of the liquid on the substrate under processing and a gas landing position of the gas on the substrate under processing to change a difference between (i) a distance from a center of the substrate to the liquid landing position and (ii) a distance from the center of the substrate to the gas landing position from a first difference to a second difference, the second difference being more than the first difference,
   form the dry region by controlling a movement speed of an interface of the dry region constituting a boundary between the liquid layer and the dry region to be less than or equal to a predetermined speed.

2. The substrate processing apparatus according to claim 1, further comprising:
   a monitoring mechanism configured to monitor the interface of the dry region constituting the boundary between the liquid layer and the dry region,
   wherein the controller is configured to, based on the monitoring result of the monitoring mechanism, control an oscillation state or an injection angle of the liquid nozzle.

3. The substrate processing apparatus according to claim 1, wherein
   the liquid nozzle includes an actuator to oscillate the liquid nozzle, and
   the controller is configured to, until the dry region is expanded to the predetermined size, form the dry region by controlling a liquid injection direction to move from a first direction to a second direction by the actuator, while causing the gas nozzle to supply the gas.

4. The substrate processing apparatus according to claim 1, wherein
   the liquid nozzle includes a horizontal moving mechanism, and
   the controller is configured to, until the dry region is expanded to the predetermined size, form the dry region by controlling the liquid landing position to move from a first position to a second position by the horizontal movement mechanism, while causing the gas nozzle to supply the gas.

5. The substrate processing apparatus according to claim 1, wherein
   the liquid nozzle includes a first liquid nozzle and a second liquid nozzle, the second liquid nozzle being located further from the gas nozzle than the first liquid nozzle, and
   the controller is configured to, until the dry region is expanded to the predetermined size, form the dry region by controlling the liquid nozzle to change from a first injecting state in which the liquid is injected onto a first position by at least the first liquid nozzle to a second injecting state in which the liquid is injected onto a second position by the second liquid nozzle, while causing the gas nozzle to supply the gas.

6. The substrate processing apparatus according to claim 5, wherein
   the controller is configured to adjust injecting the liquid from the first liquid nozzle and the second liquid nozzle and stopping injecting the liquid, and
   the liquid nozzle is configured to,
      in the first injecting state, provide the liquid onto the first position by injecting the liquid by the first liquid nozzle and the second liquid nozzle, and
      in the second injecting state, provide the liquid onto the second position by stopping injecting the liquid by the first liquid nozzle and by injecting the liquid by the second liquid nozzle.

7. The substrate processing apparatus according to claim 6, wherein,
   the first liquid nozzle includes a first valve to adjust injection and stop of the liquid from the first liquid nozzle, and
   the second liquid nozzle includes a second valve to adjust injection and stop of the liquid from the second liquid nozzle,
   the controller is configured to control opening and closing of the first valve and the second valve,
   the liquid nozzle is configured to,
      in the first injecting state, provide the liquid onto the first position by injecting the liquid by opening the first valve and the second valve, and
      in the second injecting state, provide the liquid onto the second position by stopping injecting the liquid by closing the first valve and by injecting the liquid by opening the second valve.

8. The substrate processing apparatus according to claim 1, wherein
   the controller is configured to adjust an angle of the liquid injected from the liquid nozzle, and
   the controller is configured to, until the dry region is expanded to the predetermined size, form the dry region by controlling the liquid nozzle to change the angle of the liquid injected from the liquid nozzle from a first angle to a second angle, while causing the gas nozzle to supply the gas.

9. The substrate processing apparatus according to claim 1, wherein a shape of the dry region is a circle, and a radius of the dry region in the predetermined size is equal to or less than the second distance.

10. A substrate processing apparatus for cleaning and drying a substrate under processing, comprising:
   a liquid nozzle that supplies a liquid onto the substrate under processing to form a liquid layer;
   a gas nozzle that supplies a gas onto the substrate under processing to form a dry region;
   a controller configured to control the liquid nozzle and the gas nozzle; and
   wherein:
   the controller is configured to carry out the substrate processing including:
      (1) a liquid layer forming step to form and expand the liquid layer on the substrate;
      (2) a dry region forming step to form a dry region and to expand the dry region to a predetermined size; and
      (3) a dry region expanding step to further expand the dry region from the predetermined size,
   the controller is configured to, in the liquid layer forming step, control a liquid landing position at which the liquid provided from the liquid nozzle lands on the substrate to be a predetermined position, thereby forming the liquid layer, and
   the controller is configured to, in the dry region forming step, control a gas landing position at which the gas provided from the gas nozzle lands on the substrate to be the predetermined position, thereby causing the dry region to be in a first size, and to control the liquid landing position to move closer the predetermined position on the substrate, thereby causing the dry region to be reduced to a second size, the second size being smaller than the first size, and
   the controller is configured to, in the dry region expanding step, control the liquid nozzle to move the liquid landing position, thereby causing the dry region to be expanded to a third size, the third size being larger than the second size.

11. The substrate processing apparatus according to claim 10, wherein
   a shape of the dry region is a circle, and
   a radius of the dry region in the second size is less than a distance between the gas nozzle and the liquid nozzle.

12. The substrate processing apparatus according to claim 10, wherein
   the predetermined position on the substrate is a central portion of the substrate.

13. The substrate processing apparatus according to claim 10, further comprising:
   a monitoring mechanism configured to monitor an interface of the dry region constituting a boundary between the liquid layer and the dry region,
   wherein the controller is configured to, based on the monitoring result of the monitoring mechanism, control an oscillation state or an injection angle of the liquid nozzle.

14. A substrate processing apparatus for cleaning and drying a substrate under processing, comprising:
   at least three nozzles that each inject a gas or a liquid;
   a valve that adjusts injecting and stopping the gas or the liquid from at least one of the at least three nozzles; and
   a controller that controls the at least three nozzles and the valve, wherein the controller controls opening and closing of the valve and adjusts the injection of the gas or the liquid from the at least three nozzles,
the at least three nozzles include a first nozzle, a second nozzle, and a third nozzle,
a distance between the first nozzle and the third nozzle is larger than a distance between the first nozzle and the second nozzle,
the distance between the first nozzle and the third nozzle is larger than a distance between the second nozzle and the third nozzle,
the first nozzle is a nozzle that injects the gas, the second nozzle is a nozzle that injects the liquid, and the third nozzle is a nozzle that injects the liquid, and
the controller performs a control to switch from a first injection operation of injecting the liquid to a first position using at least the second nozzle while supplying the gas from the first nozzle to a second injection operation of injecting the liquid to a second position using the third nozzle while supplying the gas from the first nozzle.

15. The substrate processing apparatus according to claim 14, wherein
   the at least three nozzles include a plurality of liquid nozzles, and
   the valve is configured to adjust injecting and stopping the liquid from each of the plurality of liquid nozzles.

16. The substrate processing apparatus according to claim 15, wherein
   the valve includes a plurality of valves provided for each of the plurality of liquid nozzles, and
   the controller independently controls the plurality of valves and independently adjusts the injection of a liquid from the plurality of liquid nozzles.

17. The substrate processing apparatus according to claim 14, wherein
   the liquid is supplied to the first position by injecting the liquid from each of the second nozzle and the third nozzle in the first injection operation, and
   the liquid is supplied to the second position by injecting the liquid from the third nozzle while stopping the injection of the liquid from the second nozzle in the second injection operation.

18. The substrate processing apparatus according to claim 17, wherein
   the second nozzle includes a first valve,
   the third nozzle includes a second valve,
   the controller controls opening and closing of the first valve and the second valve,
   the liquid is supplied to the first position by opening the first valve and the second valve to inject the liquid from the second nozzle and the third nozzle in the first injection operation, and
   the liquid is supplied to the second position by closing the first valve to stop the injection of the liquid from the second nozzle and opening the second valve to inject the liquid from the third nozzle in the second injection operation.

19. The substrate processing apparatus according to claim 14, wherein
   a position of the first nozzle is maintained while switching from the first injection operation to the second injection operation.

\* \* \* \* \*